United States Patent [19]

Geneczko

[11] Patent Number: 4,846,452
[45] Date of Patent: Jul. 11, 1989

[54] TWO-STAGE ROTATIONAL POSITIONING CHUCK FOR SUCCESSIVE MASK LAYER REGISTRATION OF ODD-SHAPED, ODD-SIZED WAFERS

[75] Inventor: Jeannie M. Geneczko, Rossmoor, Calif.

[73] Assignee: Northrop Corporation, Hawthorne, Calif.

[21] Appl. No.: 134,395

[22] Filed: Dec. 17, 1987

[51] Int. Cl.[4] ............................................. B23Q 3/08
[52] U.S. Cl. ..................................... 269/21; 269/287; 269/60; 269/65; 33/569; 33/549; 33/568
[58] Field of Search ...................... 269/287, 21, 60, 65, 269/71; 279/4; 51/235; 33/568, 569, 549; 74/89.15

[56] References Cited

U.S. PATENT DOCUMENTS 4,183,545 7/1978 Daly ....................... 269/21

FOREIGN PATENT DOCUMENTS 929627 1/1948 France ................................ 33/569
131773 11/1898 Japan ................................. 269/21

Primary Examiner—Frederick R. Schmidt
Assistant Examiner—David A. Holmes
Attorney, Agent, or Firm—Terry J. Anderson; Robert B. Block

[57] ABSTRACT

For use in a machine capable of forming integrated circuits or the like on an odd-shaped, odd-sized semiconductor wafer, an improved chuck assembly, for increasing the rotational adjustment capabilities of the chuck assembly and a semiconductor wafer supported thereon. The chuck assembly comprises a mounting ring having a circular configuration formed of a plate and a peripheral wall forming a circular recess extending from a surface of the mounting ring. The chuck assembly also comprises a chuck plate having a circular configuration adapted to be received within the recess of the mounting ring. A lever extends radially from one edge of the chuck plate through an opening in the side wall of the mounting ring. An adjusting bracket is secured to the exterior edge of the mounting ring. Further, a screw is rotatably supported in a threaded aperture in the adjusting bracket and coupled to the lever whereby rotation of the screw will move the lever for adjusting the angular orientation of the chuck plate with respect to the mounting ring.

17 Claims, 1 Drawing Sheet

TWO-STAGE ROTATIONAL POSITIONING CHUCK FOR SUCCESSIVE MASK LAYER REGISTRATION OF ODD-SHAPED, ODD-SIZED WAFERS

BACKGROUND OF THE INVENTION

1. Field of the Invention

This invention relates to the rotational positioning of a chuck for supporting a semiconductor wafer and, more particularly, to a two-stage rotational positioning chuck assembly with increased rotational capabilities for successive mask layer registration of odd-shaped, odd-sized semiconductor wafers supported by the chuck assembly.

2. Description of the Background Art

Integrated circuits and other miniaturized electronic component formed on semiconductor wafers, such as silicon, are important in today's electronic industry. Fabrication of such integrated circuits and other electronic components is normally effected by supporting a semiconductor wafer in a machine whereby the wafer may be subjected to photolithographic steps. More specifically, the silicon wafer is first coated with a photoresist layer and then exposed to x-rays, ultraviolet or other electron or photon rays in a pattern determined by a preselected mask. When the process is repeated with the wafer being exposed through plural but correlated masks for successive mask layer registration, the desired integrated circuit or other electronic component is formed on the wafer.

One typical machine capable of sequentially exposing patterns in registration onto silicon wafers is the 6000 Series DSW machine manufactured by GCA Corporation, IC Systems Group of Bedford, Massachusetts Such machines, however, can only be as accurate as the initial positioning or alignment of the wafer on the chuck of the machine. Initial alignment is effected by an operator moving the chuck and its supported wafer through the use of the joy stick or other mechanical mechanism capable of moving the chuck plate and wafer in a first or x direction, in a second perpendicular or y direction, and in a third or theta rotational direction about the axis of the chuck and wafer. During the moving of the chuck and wafer, the operator visually observes and aligns two prepositioned marks or keys on the wafer through optical columns in the machine. When the operator properly moves the chuck and wafer to align the keys, the wafer will then be properly aligned within the machine for processing.

A variety of commercially available machines are well suited for the initial alignment of silicon wafers manufactured to standard dimensions. A first or coarse alignment or positioning may be done automatically by taking advantage of the roundness of the wafer and well-defined flats formed in their edges. A spindle off-site of the chuck can rotate a wafer 360° as a mechanical flat finder searches for the flat edge. Once it finds this flat edge, the wafer is loaded onto the chuck by an automatic wafer handler for the second or fine alignment. A second or fine alignment or positioning is then done mechanically and optically by precisely aligning the alignment keys on the wafer, which are spaced apart at a predetermined distance to the optical column. Manual loading of silicon wafers onto the chuck by placing the well-defined flat in contact with a wafer stop is not preferred because a) any initial misalignment of the wafer onto the chuck would increase the amount of time needed to do the fine alignment and would, therefore, increase wafer processing time and cost, and b) a microscope would need to be built into the optical column in order to do a first or coarse adjustment This would minimize the space available in the column for advanced optics.

Indium antimonide wafers are preferred over silicon wafers for certain electronic applications. These wafers, however, are fragile and must be handled with extreme care, for not only do they chip and break easily, but wafer handling also affects their electrical characteristics Therefore, any wafer handling as during alignment and processing must be minimized. One way is to replace the present wafer aligning mechanisms that require constant top and bottom surface contact with the wafer with new mechanisms which provide for backside contact only such as the DSW machine. The problem occurs in finding an aligner that can be used with indium antimonide or like wafers which are characterized by their odd-shapes and odd-sizes.

These wafers, because their shapes and sizes vary by ingot, are not susceptible to automatic positioning and alignment in machines and, therefore, must be mounted onto the chuck manually. Guides are of limited use in the coarse positioning of these wafers since in many cases there is not a well defined wafer flat or edge for coarse positioning purposes. Even so, x and y corrections can be easily made with existing aligners. However, movement in the critical theta direction is so severely limited that it is virtually impossible to align these wafers with the commercially available chucks. As a result, a new chuck of the present invention was designed and developed for use on the indium antimonide wafers.

In addition to the chuck positioning apparatus of the above-referred to 6000 Series DSW machine, the patent literature discloses other mechanisms for chuck and wafer positioning and alignment. By way of example, U. S. Pat. No. 3,685,117 to Wing; 3,969,004 to Schliemann and 4,544,311 to Husain disclose chuck positioning devices for use in association with mask alignment. In addition, U.S. Pat. Nos. 3,990,689 to Eklund; 4,066,943 to Roch; and 4,448,403 to Riessland disclose chuck positioners for testing purposes. All of these prior art devices require complex mechanisms for effecting chuck movement and are limited in their extent of rotational movement.

These and other advances in chuck assemblies for wafer alignment are commercially available and are described in the literature. All are noteworthy to one extent or another, but none achieves the objective of an efficient, accurate, convenient and inexpensive device to initially align semiconductor wafers in a machine for forming integrated circuits or similar electronic components thereon, the apparatus being particularly designed to accommodate the specific needs of odd-shaped, odd-sized wafers such as indium antimonide.

As illustrated by the great number of prior patents as well as commercial devices, efforts are continuously being made in an attempt to improve adjustable chuck assemblies to render them more efficient, accurate, convenient and economical in the positioning of semiconductor wafers. None of these previous efforts, however, provides the benefits attendant with the present invention. Additionally, prior methods and devices do not suggest the present inventive combination of component elements arranged and configured as disclosed and claimed herein. The present invention achieves its intended purposes, objects and advantages over the prior art devices through a new, useful and unobvious combination of component elements, with the use of a minimum number of functioning parts, at a reasonable cost to manufacture, and by employing only readily available materials.

Therefore, it is an object of this invention to provide an improved chuck assembly for efficiently, accurately, conveniently and economically positioning semiconductor wafers in machines for forming integrated circuits and other electronic components thereon.

It is another object of this invention to adjust the angular position of odd-shaped, odd-sized semiconductor wafers in fabrication machines over a wide range of rotation.

It is a further object of the invention to align indium antimonide semiconductor wafers in machines prior to processing.

Lastly, it is an object of the present invention to provide an improved chuck assembly, for use in machines capable of forming integrated circuits or the like on odd-shaped, odd-sized semiconductor wafers, for increasing the rotational adjustment capabilities of the chuck assembly and a semiconductor wafer supported thereon, the chuck assembly comprising a mounting ring having a circular configuration formed of a plate and a peripheral wall forming a circular recess extending from a surface of the mounting ring, a chuck plate having a circular configuration adapted to be received within the recess of the mounting ring, a lever extending radially from one edge of the chuck plate through an opening in the side wall of the mounting ring, an adjusting bracket secured to the exterior edge of the mounting ring, and a screw rotatably supported in a threaded aperture in the adjusting bracket and coupled to the lever whereby rotation of the screw will move the lever for adjusting the angular orientation of the chuck plate with respect to the mounting ring.

The foregoing has outlined some of the more pertinent objects of the invention These objects should be construed to be merely illustrative of some of the more prominent features and applications of the intended invention. Many other beneficial results can be attained by applying the disclosed invention in a different manner or by modifying the invention within the scope of the disclosure. Accordingly, other objects and a fuller understanding of the invention may be had by referring to the summary of the invention and the detailed description of the preferred embodiment in addition to the scope of the invention as defined by the claims taken in conjunction with the accompanying drawings.

SUMMARY OF THE INVENTION

The present invention is defined by the appended claims with the specific embodiment shown in the attached drawings. For the purpose of summarizing the invention, the invention may be incorporated into apparatus for effecting rotational movement. The apparatus comprises a first rotatable member with a circular configuration and formed with a circular recess therein, a second rotatable member with a circular configuration and positionable within the recess of the first member for rotation with the first member, and means associated with the second member for effecting rotation of the second member with respect to the first member. The last mentioned means is a lever extending radially from the periphery of the second member beyond the periphery of the first member. The apparatus further includes an operator controlled adjustment mechanism secured with respect to the first member for rotationally moving the lever and the second member with respect to the first member.

In addition, for the purposes of summarizing the invention, the invention may also be incorporated into an improved chuck assembly, for use in a machine capable of forming integrated circuits or -he like on a semiconductor wafer, to increase the rotational adjustment capabilities of the chuck assembly and a semiconductor wafer supported thereon. The chuck assembly comprises a mounting ring having a circular configuration formed of a plate and a peripheral wall forming a circular recess extending from a surface of the mounting ring. The chuck assembly also comprises a chuck plate having a circular configuration adapted to be received within the recess of the mounting ring. A lever extends radially from one edge of the chuck plate through an opening in the side wall of the mounting ring. An adjusting bracket is secured to the exterior edge of the mounting ring. Further, a screw is rotatably supported in a threaded aperture in the adjusting bracket and coupled to the lever whereby rotation of the screw will move the lever for adjusting the angular orientation of the chuck plate with respect to the mounting ring.

The chuck assembly further includes a washer removably received by one end of the screw and coupled to the radially exterior end of the lever. The lever is formed of a threaded bolt having its radially interior end rotatably supported in a threaded aperture formed in the edge of the chuck plate and having its radially exterior end formed with a slot, the slot being of such size as to receive the washer. The mounting ring and the chuck plate are formed with concentric central aperture having a common axis whereby a vacuum may be drawn therethrough to retain a semiconductor wafer on the surface of the chuck plate remote from the mounting rig. The surface of the chuck plate remote from the mounting ring is formed with slots operatively associated with the central aperture whereby a drawn vacuum may act upon an enlarged area of the supported semiconductor wafer. The chuck assembly further includes stop bar means to assist in the positioning of a semiconductor wafer on the exterior surface of the chuck plate. The chuck assembly further includes a circular projection depending from the surface of the chuck plate adjacent to the mounting ring and a circular well in the plate of the mounting ring on the surface thereof adjacent to the chuck plate for receiving the projection of the chuck plate. The chuck assembly further includes a circular recess formed in the edge of the chuck plate and a plurality of set screws projecting through the wall of the mounting ring for being received by the circular recess for use in the locating and the securing of the chuck plate with respect to the mounting ring.

Lastly, for the purpose of summarizing the invention, the invention may be incorporated into a machine for forming integrated circuits or other electronic components on a wafer of indium antimonide or the like, the machine having an improved chuck assembly for increasing the rotational adjustment capabilities of the chuck as well as the supported wafer. The chuck assembly comprises in combination: (a) a mounting ring having a circular configuration formed of a base plate constituting its lower surface and an upstanding peripheral wall which together form a circular recess extending downwardly from the upper surface of the mounting ring, the mounting ring having a circular aperture centrally formed through the base plate; (b) a chuck plate having a generally flat, circular configuration adapted to be received within the circular recess of the mounting ring, the chuck plate having a circular aperture centrally formed through the chuck plate whereby a vacuum may be drawn therethrough to retain a wafer on the upper surface of the chuck plate, and a groove formed in the edge of the chuck plate with a plurality of set screws projecting through the wall of the mounting ring and received by the groove to assist in the locating and the securing of the chuck plate with respect to the mounting ring; (c) a lever extending radially from one edge of the chuck plate through an opening in the side wall of the mounting ring, the lever being formed of a threaded bolt having its radially exterior end threadedly received in an aperture formed in one edge of the chuck plate and with a slotted head at its radially exterior end; (d) an adjusting bracket secured to the exterior edge of the mounting ring; and (e) a socket head screw threaded through an aperture in the adjusting bracket and coupled to the lever whereby rotation of the socket head screw will move the lever in response to the rotation of the socket head screw for adjusting the angular orientation of the chuck plate with respect to the mounting ring.

The foregoing has outlined- rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same- purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be had to the following detailed description taken in conjunction with the accompanying which:

FIG. 8 is an enlarged perspective illustration of a portion of the adjusting mechanisms shown in FIG. 7 particularly illustrating the lever and washer in greater detail.

Similar reference characters refer to similar parts throughout the several drawings.

DETAILED DESCRIPTION OF THE INVENTION

Figure 1:
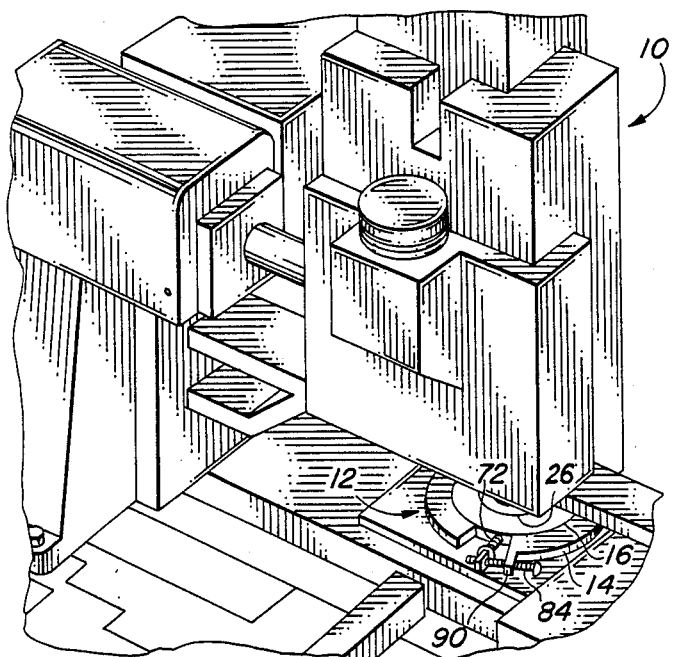
FIG. 1 is a perspective illustration of a portion of a machine for forming integrated circuits or similar electrical components on a semiconductor wafer, the machine being provided with a wafer-supporting chuck assembly constructed in accordance with the principles of the present invention.
Figure 2:
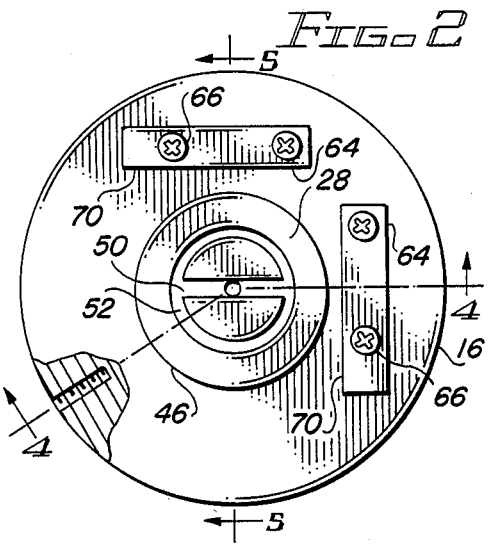
FIG. 2 is an elevational view of the chuck plate, a major component of the chuck assembly as shown in FIG. 1.
Figure 4:
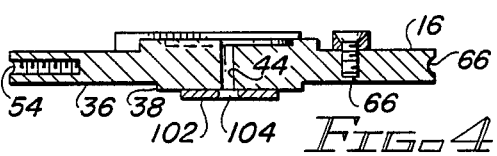
FIG. 4 is a sectional view of the chuck plate shown in FIG. 2 taken along line 4—4 of FIG. 2.
Figure 5:
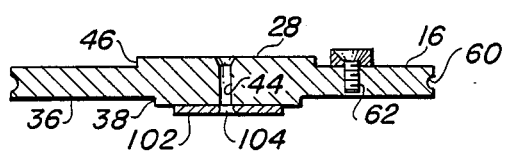
FIG. 5 is a sectional view of the chuck plate shown in FIG. 2 taken along line 5—5 of FIG. 2.
Figure 6:
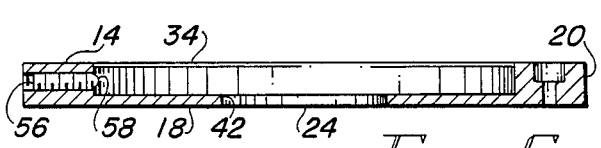
FIG. 6 is a sectional view of the mounting ring shown in FIG. 3 taken along line 6—6 of FIG. 3.

A part of the machine 10 in which the present invention may be utilized is shown generally in FIG. 1. The machine is shown, for illustrative purposes as the commercially available 6000 Series DSW machine referred to hereinabove but with the chuck assembly 12 of the present invention replacing the previously utilized chuck. The chuck or chuck assembly 12 of the present invention includes two major components, the mounting ring 14 and the chuck plate 16. The mounting ring is most clearly seen in FIG. 3. It can also be seen in FIG. 6, a sectional view taken along line 6—6 of FIG. 3. The chuck plate is most clearly seen in FIG. 2 but can also be seen in FIGS. 4 and 5, sectional views taken along line 4—4 and 5—5 of FIG. 2.

The mounting ring 14 is a generally flat metallic member in a circular configuration. It has a lower base plate 18 and an upstanding, peripheral, circular wall 20 with an opening 22 formed therein. The lower base plate 18 is formed with a central, circular aperture 24. A circular recess 32 extends between the upper surface 34 of the base plate and the lower base plate 18, the recess 32 being of such size as to receive the chuck plate 16 therein during operation and use. The depth of the recess is substantially equal to the thickness of the chuck plate. The recess is essentially surrounded by the wall 20 for retaining the chuck plate in proper concentric orientation with respect to the mounting ring 14. Provided in the wall 20 of the mounting ring is the circumferential opening 22, equal to about four degrees of rotation for the receipt of the adjusting mechanism as will be described more fully hereinafter.

The chuck plate 16 is formed as a generally flat member of a circular configuration. Its lower face 36 has a circular projection 38 for being received within a circular well 42 in the adjacent surface of the lower base plate 18 of the mounting ring. Central apertures 24 and 44 extend through the chuck plate 16 and mounting ring 14 through which a vacuum may be drawn for holding the wafer 26 onto the upper surface of the chuck plate 16. The upper surface 28 of the chuck plate has a raised central portion 46 in its central extent for the receipt thereon of the wafer to be aligned and processed. The surface of the chuck plate which supports the wafer is provided with a slot 50 and interconnected circular groove 52 whereby a vacuum drawn through the central aperture will provide a vacuum to hold the wafer onto the chuck plate by the reduced pressure in the slot 50 and interconnected circular groove 52. The vacuum force is enhanced by the enlarged area of vacuum contact provided by the slot and groove. Note FIGS. 4 and 5 for sectional views of the chuck plate taken along lines 4—4 and 5—5 of FIG. 2, respectively.

Provided in the wall 20 o the mounting ring are a plurality of radially disposed tapped holes 54, preferably three, in which are located an equal number of set screws 56. Nylon tips 58 are formed only the set screws to preclude abrasion of the edge of the chuck plate during contact. In this manner, the set screws 56 may be advanced into the recess 32 a predetermined distance to provide for bearing surfaces which contact a groove 60 in the edge of the chuck plate for positioning and retention purposes of the chuck plate with respect to the mounting ring.

Also located on the upper surface 28 of the chuck plate are a plurality of threaded apertures 62 by which stop bars 64 may be secured to the chuck plate through flat head screws 66. The stop bars are located at right angles with respect to each other for constituting reference surfaces 70 against which a wafer may be aligned. As can be understood, with a wafer in proper position on the chuck plate and the chuck plate located within the recess of the mounting ring, the chuck plate may be rotated within a great degree of rotational latitude as determined by the extent of the opening 22 in the wall. The rotational latitude, about four degrees, allowed by the two-part chuck assembly of the present invention is significantly greater than the rotational latitude, less than one degree, previously provided by the one-piece chuck of the 16000 Series DSW and other known machines. Without such extended latitude of adjustment, no machine could accurately expose an array of images onto odd-shaped, odd-sized indium antimonide wafers without excessive handling which would occur during repeated trial and error positioning of the wafer on the chuck.

The stop bars of the known commercial machines are adequate to constitute abutment surfaces for use in the coarse positioning of silicon wafers due to their well defined flat edges. Odd-shaped, odd-sized wafers, however, provide no well defined flat edges. As a result, the stop bars only roughly or coarsely position indium antimonide wafers because of the absence of a well-defined edge. This dictates the need for the chuck assembly of the present invention with its increased rotational capabilities.

Radially extending from one ledge of the chuck plate is a bolt 72 threadedly received is a threaded aperture 74 of the chuck plate. This bolt functions as a lever and has a conventional slot 76 at its radially exterior edge. The length of the bolt or lever 72 is sufficient to extend from the edge of the chuck plate to beyond the peripheral edge of the mounting ring through the circumferential opening. Movement of the lever may be effected from one edge of the opening to the other for a rotational displacement of about four degrees.

The slot 76 at the head or radially exterior end of the bolt is adapted to receive a flat edge 78 of the washer 80 to preclude unwanted rotation of the bolt 72 about its axis and to move the lever and chuck plate rotationally with respect to the mounting ring. The washer 80 is secured to the free end of a socket head screw 84 through small washers 86 and a small socket head screw 88 most clearly seen in FIG. 7. The socket head screw 84 is threadedly engaged through a threaded aperture in one leg 90 of an L-shaped adjusting bracket 92, the adjusting bracket being fixedly secured to the mounting ring near one edge of the opening through the other leg 94 of the L-shaped bracket. Socket head screws 96 fixedly secure the adjusting bracket in its intended position. Finally, apertures 98 in the mounting ring are adapted to secure the mounting plate and, hence, the chuck assembly to the machine 10 for operation and use.

Figure 3:
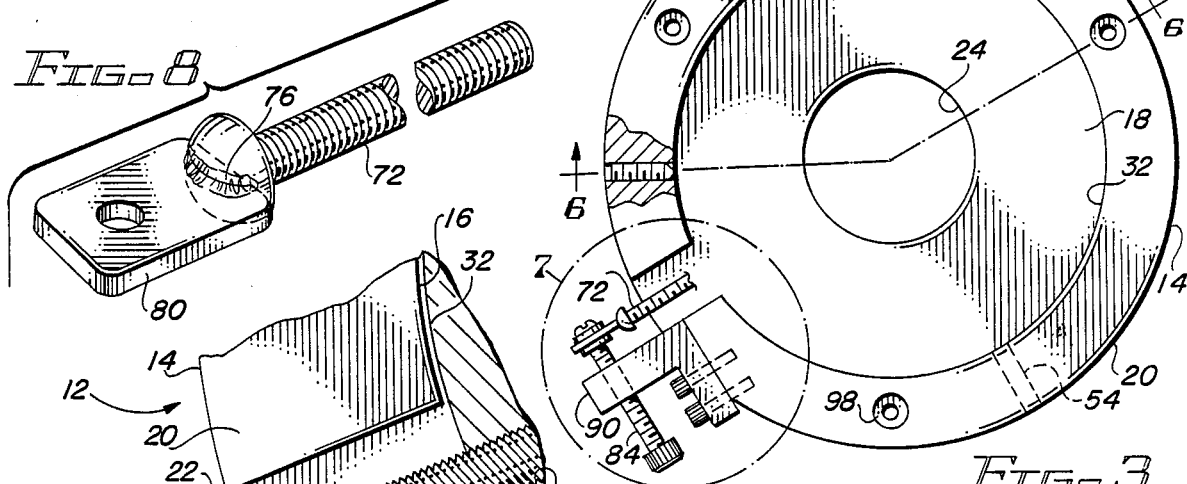
FIG 3 is an elevational view of the mounting ring, another major component of the chuck assembly as shown in FIG. 1.
Figure 7:
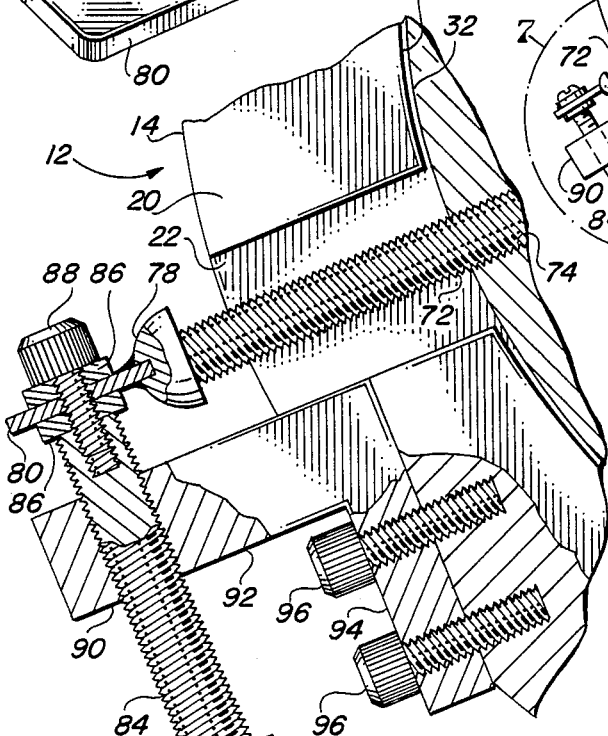
FIG. 7 is an enlarged elevational view of a portion of the mounting ring shown in FIG. 3 particularly illustrating the adjusting mechanisms in greater detail.

As can be best understood by reference to the circled insert of FIG. 3 and, more particularly, in FIG. 7 as well as in FIG. 8, rotation of the socket head screw about its axis will advance or retract the socket head screw along its axis whereby the washer with its flat edge will move the lever from one edge of the slot to the other edge for rotationally repositioning the chuck plate within and with respect to the mounting ring and the wafer within and with respect to, the washer. The small socket head screw may be removed from the large socket head screw for removing the washer from the slot of the lever. In this manner, the lever may be threaded into or out of its aperture in the chuck plate for adjusting the coupling of the washer to the lever.

When positioned for operation and use, the lower face of the inner chuck plate 16 is located above that portion of the machine 10 through which the hold down vacuum is to be drawn. Intermediate therebetween is a washer-like member or element 102. The exterior diameter of the element 102 is about half the diameter of the circular projection 38. Its inner diameter is formed as a hole 104 essentially functioning as an extension of central aperture 44. The washer-like element has generally rounded interior and exterior edges with generally flat, parallel surfaces. It is fabricated of a flexible, resilient, porous material such as an open-cell polymer, polyethylene or polyurethane, for example. This allows a limited quantity of air to flow therethrough when a vacuum is drawn in the machine to hold the wafer 26 onto the chuck plate 16 and the chuck plate 16 onto the mounting ring 14 and the entire assembly onto the machine 10. The upper extent of the washer-like member 102 extends upwardly into the aperture 24 to a very limited degree since the projection 38 extends downwardly a distance less than the depth of aperture 24. As the vacuum is increased, the assembly 12 and its components will be increasingly drawn downwardly toward the machine 10 resulting in a decrease in the porosity of the washer-like member to thereby increase the forces holding the wafer, components of the assembly, and the machine against unintended mutual rotation. It has been found in practice, however, that the holding force generated by the vacuum will not preclude intended rotational movement effected by the operator for adjustment purposes.

During the use of previously known chuck assemblies, an operator initially placed the wafer on the chuck plate in the machine with a flat edge or edges of the wafer in contact with a stop bar or bars. This would effect a first or coarse placement or alignment and could be done manually but preferably automatically. Such coarse placement of the wafer on the chuck plate would be fairly accurate when the wafer was a silicon wafer which is characterized by good roundness and well-defined flat edges for mechanical alignment of the wafer to the stop bar or bars of the chuck plate. An optical microscope added to the optical column would be necessary to do the first or coarse adjustment. This would limit the space available in the column for advanced optics. An alternate approval in use is that of a spindle off-site of the chuck that can rotate a wafer 360° as a mechanical flat finder searches for the flat edge. Once it finds this flat edge, the wafer is loaded onto the chuck for the second or fine alignment. A second or fine alignment would then be done manually by the operator through the utilization of the joy stick or other mechanisms correlated with the operator visually observing the movement and alignment through the optical columns. A second or fine alignment may also be done automatically if the first placement or coarse adjustment is done automatically.

Such method and apparatus, however, are not well suited when processing wafers 26 of indium antimonide. This is because such indium antimonide wafers are not well rounded due to their method of fabrication and cannot be provided with accurate, predetermined, flat reference edges. While the previously known machines are adequately suited for initial alignment of odd-shaped, odd-sized wafers along the X axis and Y axis, they are not normally suitable for rotational or theta adjustments since the odd-shaped, odd-sized wafers often require extensive rotational alignment prior to processing. In utilizing the chuck assembly 12 of the present invention, the operator would first manually place the odd-shaped, odd-sized wafer 26 on the chuck plate 16 as accurately as possible for the coarse alignment. The operator would then effect an additional coarse adjustment through the rotation of the chuck plate 16 within the mounting ring 14 by moving the lever 72 while visually observing keys on the wafer through the optical columns of the machine 10. This would then be followed by the joint rotation with visual observation of the chuck plate 16 and mounting ring 14 as was done with the previously known machine for final alignment. With the wafer accurately positioned, the vacuum may be drawn to secure the wafer in position whereafter the machine may function in its intended mode of operation for forming the integrated circuit or other electronic component on the wafer.

This chuck of the present invention differs from known chucks in that it is actually two parts, or essentially a chuck 16 within a chuck 14. A small inner chuck or chuck plate 16 upon which the wafer 26 sits is nestled within a larger chuck or mounting ring 14 which is mechanically attached to the aligner of the machine. The inner chuck 16 is initially aligned to the outer chuck 14. Its purpose is to allow for larger rotational adjustments. After the wafer is manually placed on the inner chuck 16 in a coarse position, the machine 10 automatically moves the chuck 14 and wafer to the alignment position. Longitudinal X and y corrections are then made manually via the joy stick by the operator during visual observation. Rotational coarse adjustment is then effected by manually moving the inner chuck 16 with respect to the outer chuck 14 through lever 72 while alignment keys are visually located by the operator. After this coarse alignment, fine alignment is effected with the joy stick as in the known manner by utilizing the wafer aligner in the manual mode. Any further rotational corrections are within the designed capabilities of the unit.

Successful and repeated alignment of odd sized wafers has been performed with this new design. This new chuck has added 4 degrees to the rotational capability of the old design. Minor modifications to the chuck within a chuck concept can further enhance this capability. The new chuck can extend the usefulness of the prior art units to all odd-shaped and odd-size wafers, something that could not be done before the present invention.

The present disclosure includes that contained in the appended claims as well as that of the foregoing description. Although this invention has been described in its preferred forms with a certain degree of particularity, it is understood that the present disclosure of the preferred form has been made only by way of example and that numerous changes in the details of construction and combination and arrangement of parts may be resorted to without departing from the spirit of the invention.

Now that the invention has been described,
What is claimed is:

1. A rotationally adjustable chuck assembly for a photolithographic machine for manufacturing integrated circuits, said machine having a vacuum system for being connected to said chuck assembly comprising
   a mounting ring having a lower surface mounted for support to the machine and an upper surface.
   means forming a circular recess extending inwardly from said upper surface, said circular recess having an axis normal to said upper surface,
   a chuck plate having circular configuration adapted to be received within said mounting ring recess for rotation about said axis,
   said chuck plate having an upper surface for receiving a wafer and a vacuum passage extending to said upper surface,
   a washer for supporting said chuck plate on said machine and having a passage in communication with said passage in said chuck plate for passing vacuum therethrough,
   means interposed laterally between the mounting ring and the chuck plate for securing the chuck plate vertically and laterally, while allowing partial rotation of the chuck plate about said axis and on said washer, and
   fine adjust means including screw means arranged tangentially of said chuck plate and coupled between said mounting ring and the chuck plate for adjusting the angular position of said chuck plate about said axis,
   said washer being made of open cell porous polymer which absorbs a portion of the vacuum force to allow fine adjustment of the angular position of the chuck to be made while vacuum is maintained on said chuck plate and said wafer.

2. The chuck assembly as in claim 1 in which said fine adjust means includes
   a lever extending radially from one edge of the chuck plate through an opening in the side wall of the mounting ring,
   an adjusting bracket secured to the exterior edge of the mounting ring, and
   a screw rotatably supported in a threaded aperture in the adjusting bracket and coupled to the lever whereby rotation of the screw will move the lever for adjusting the angular orientation of the chuck plate with respect to the mounting ring.

3. The chuck assembly was set forth in claim 2 and further including a washer removably received by one end of the screw and coupled to the radially exterior end of the lever.

4. The chuck assembly as set forth in claim 3 wherein the lever is formed of a threaded bolt having its radially interior end rotatably supported in a threaded aperture formed in the edge of the chuck plate and having its radially exterior end formed with a slot, the slot being of such size as to receiver the washer.

5. The chuck assembly as set forth in claim 1 wherein the mounting ring and the chuck plate are formed with concentric central apertures having a common axis whereby a vacuum may be drawn therethrough to retain a semiconductor wafer on the surface of the chuck plate remote from the mounting ring.

6. The chuck assembly as set forth in claim 5 wherein the surface of the chuck plate remote from the mounting ring is formed with slots operatively associated with the central aperture whereby a drawn vacuum may act upon an enlarge area of the supported semiconductor wafer.

7. The chuck assembly as set forth in claim 6 and further including stop bar means to assist in the positioning of a semiconductor wafer on the exterior surface of the chuck plate.

8. The chuck assembly as set in claim 1 and further including a circular projection depending from the surface of the chuck plate adjacent to the mounting ring and a circular well in the plate of the mounting ring on the surface thereof adjacent to the chuck plate for receiving the projection of the chuck plate.

9. For use in a machine capable of forming integrated circuits or the like on a semiconductor wafer, an improved chuck assembly to increase the rotational adjustment capabilities of the chuck assembly and a semiconductor wafer supported thereon comprising:
   a mounting ring having a circular configuration formed of a plate and a peripheral wall forming a circular recess extending from surface of the mounting ring,
   a chuck having a circular configuration adapted to be received within the recess of the mounting ring,
   a lever extending radially from one edge of the chuck plate through an opening in the side wall of the mounting ring,
   an adjusting bracket secured to the exterior edge of the mounting ring,
   a screw rotatably supported in a threaded aperture in the adjusting bracket and coupled to the lever whereby rotation of the screw will move the lever for adjusting the angular orientation of the chuck plate with respect to the mounting ring,
   a washer removably received by one end of the screw and coupled to the radially exterior end of the lever.

10. The chuck assembly as set forth in claim 9 wherein the lever is formed of a threaded bolt having its radially interior end rotatably supported in a threaded aperture formed in the edge of the chuck plate and having its radially exterior end formed with a slot, the slot being of such size as to receive the washer.

11. The chuck assembly as set forth in claim 9 wherein the mounting ring and the chuck plate are formed with concentric central apertures having a common axis whereby a vacuum may be drawn therethrough to retain a semiconductor wafer on the surface of the chuck plate remote from the mounting ring.

12. The chuck assembly as set forth in claim 11 wherein the surface of the chuck plate remote from the mounting ring is formed with slots operatively associated with the central aperture whereby a drawn vacuum may act upon an enlarged area of the supported semiconductor wafer.

13. The chuck assembly as set forth in claim 12 and further including stop bar means to assist in the positioning of a semiconductor wafer on the exterior surface of the chuck plate.

14. The chuck assembly as set forth in claim 9 and further including a circular projection depending from the surface of the chuck plate adjacent to the mounting ring and a circular well in the plate of the mounting ring on the surface thereof adjacent to the chuck plate for receiving the projection of the chuck plate.

15. The chuck assembly as set forth in claim 14 and further including a circular recess formed in the edge of the chuck plate and a plurality of set screws projecting through the wall of the mounting ring for being received by the circular recess for use in the locating and the securing of the chuck plate with respect to the mounting ring.

16. For use in a machine capable of forming integrated circuits of the like on a semiconductor wafer, an improved chuck assembly to increase the rotational adjustment capabilities of the chuck assembly and a semiconductor wafer supported thereon comprising:
   a mounting ring having a circular configuration formed of a plate and a peripheral wall forming a circular recess extending from a surface of the mounting ring,
   a chuck plate having a circular configuration adapted to be received within the recess of the mounting ring,
   a lever extending radially from one edge of the chuck plate through an opening in the side wall of the mounting ring,
   an adjusting means secured to the exterior edge of the mounting ring and connected to said lever to rotate said chuck plate,
   a circular recess formed in the edge of the chuck plate, and
   a plurality of set screws projecting through the wall of the mounting ring for being received by the circular recess for use in the locating and the securing of the chuck plate with respect to the mounting ring.

17. In a machine for forming integrated circuits or other electronic components on a wafer of indium antimonide or the like, an improved chuck assembly for increasing the rotational adjustment capabilities of he chuck as well as the supported wafer comprising, in combination:
   a mounting ring having a circular configuration formed of a base plate constituting its lower surface and an upstanding peripheral wall which together form a circular recess extending downwardly from the upper surface of the mounting ring, the mounting ring having a circular aperture centrally formed through the base plate;
   a chuck plate having a generally flat, circular configuration adapted to be received within the circular recess of the mounting ring, the chuck plate having a circular aperture centrally formed through the base plate whereby a vacuum may be drawn therethrough to retain a wafer on the upper surface of the chuck plate, and a groove formed in the edge of the chuck plate with a plurality of set screws projecting through the wall of the mounting ring and received by the groove to assist in the locating and the securing of the chuck plate with respect to the mounting ring;
   a lever extending radially from one edge of the chuck plate through an opening in the side wall of the mounting ring, the lever being formed of a threaded bolt having its radially exterior end threaddedly received in an aperture formed in one edge of the chuck plate and with a slotted head at its radially exterior end;
   an adjusting bracket secured to the exterior edge of the mounting ring;
   a socket head screw threaded through an aperture in the adjusting bracket and coupled to the lever whereby rotation of the socket head screw will move the lever in response to the rotation of the socket head screw for adjusting the angular orientation of the chuck plate with respect to the mounting ring; and a washer-like element positioned beneath the chuck plate, the washer-like element being fabricated of an open-cell polymeric foam.

* * * * *